(12) United States Patent
Qiu (10) Patent No.: US 8,367,451 B2
(45) Date of Patent: Feb. 5, 2013

(54) METHOD AND STRUCTURES FOR FABRICATING MEMS DEVICES ON COMPLIANT LAYERS

(75) Inventor: Jin Qiu, Sunnyvale, CA (US)

(73) Assignee: Wispry, Inc., Irvine, CA (US)

( * ) Notice: Subject to any disclaimer, the term of this patent is extended or adjusted under 35 U.S.C. 154(b) by 1202 days.

(21) Appl. No.: 12/178,563

(22) Filed: Jul. 23, 2008

(65) Prior Publication Data

US 2009/0134513 A1    May 28, 2009

Related U.S. Application Data

(60) Provisional application No. 60/961,649, filed on Jul. 23, 2007, provisional application No. 60/961,591, filed on Jul. 23, 2007.

(51) Int. Cl.
*H01L 21/00*    (2006.01)

(52) U.S. Cl. .................. 438/53; 438/619; 257/E21.495

(58) Field of Classification Search .................. 438/411, 438/422, 619; 257/E21.495
See application file for complete search history.

(56) References Cited

U.S. PATENT DOCUMENTS

| 6,746,891 B2 * | 6/2004 | Cunningham et al. .......... 438/52 |
| 2004/0097066 A1 * | 5/2004 | Ozgur ............................ 438/619 |

* cited by examiner

*Primary Examiner* — Chandra Chaudhari
(74) *Attorney, Agent, or Firm* — Jenkins, Wilson, Taylor & Hunt, P.A.

(57) ABSTRACT

Methods and structures for fabricating MEMS devices on compliant layers are provided. In particular, disclosed are methods and structures that can include the use of a sacrificial layer composed of a material having material properties relative to one or more other layers. These methods and structures can reduce final device shape sensitivity to process parameters, deposition temperature differences, specific material, time, and/or geometry. Further, such methods and structures can improve the final as-built shape of released devices, reduce variability in the as-built shape, eliminate decoupling of the deposited layers from the substrate, and reduce variability across a product array, die, or wafer.

15 Claims, 8 Drawing Sheets

METHOD AND STRUCTURES FOR FABRICATING MEMS DEVICES ON COMPLIANT LAYERS

RELATED APPLICATIONS

The presently disclosed subject matter claims the benefit of U.S. Provisional Patent Application Ser. No. 60/961,649, filed Jul. 23, 2007, and also U.S. Provisional Patent Application Ser. No. 60/961,591, filed Jul. 23, 2007, the disclosures of which are incorporated herein by reference in their entireties. This application is also related to U.S. Utility patent application Ser. No. 12/178,554, filed Jul. 23, 2008, the same date as this application, which is also incorporated in its entirety by reference herein.

TECHNICAL FIELD

The present subject matter generally relates generally to micro-electro-mechanical systems (MEMS) methods and devices or structures. More particularly, the present subject matter relates to methods and structures for fabricating MEMS devices by depositing and patterning materials on a sacrificial layer.

BACKGROUND

Micro electro-mechanical systems (micromachines or MEMS devices) have a wide variety of applications and are becoming more prevalent in commercial products. MEMS devices can be fabricated by a variety of methods, one of which is the layer-by-layer deposition and patterning of materials on a substrate. In particular, one of these layers can be a sacrificial layer that provides a foundation upon which the MEMS device can be constructed, and which can be removed once the device fabrication is complete.

One example of MEMS fabrication using a sacrificial layer is the deposition of a polysilicon layer on a phosphosilicate glass (PSG) that is removed at the end of the process. More generally, the sacrificial layer can be replaced with other materials such as polyimide, amorphous carbon, silicon, porous silicon, amorphous silicon, polysilicon polycrystalline SiGe, Al, Cu, Mo or other sacrificial material. More generally, the device layer can be a single layer (e.g. polysilicon, Al, Au, Cu, Polyimide, $Si_xN_y$, silicon) or multilayer composites including metals, dielectric, polymers, and semiconductors (e.g. metal-oxide-metal, oxide-metal-oxide, etc.). Once the device layer is patterned into the desired shape, the sacrificial layer can be removed by an etchant that is appropriate for the sacrificial material being used.

Unfortunately, the use of a sacrificial layer in this way can adversely affect the fabrication and performance of a MEMS device. In particular, methods of fabricating MEMS devices that involve the deposition and removal of a sacrificial layer can produce devices having stress imbalances, low maximum capacitance, low capacitance density, low capacitance ratio, low capacitance change ($\Delta C$) of fixed capacitors, high device curvature, biaxial curvature, high actuation voltage, mechanical instability, and/or other forms of variability in behavior among multiple arrays, dies, wafers, or lots.

SUMMARY

In one aspect, the presently disclosed subject matter can provide a method and structure for fabricating a suspended, tri-layer MEMS structure. The method and structure can include providing a substrate, depositing a sacrificial layer on the substrate, depositing a first film layer on the substrate and over the sacrificial layer, depositing a second film layer on the first film layer, depositing a third film layer on the second layer, and removing the sacrificial layer by etching to suspend at least a portion of the tri-layer structure in a spaced-apart manner over the substrate. Depositing the sacrificial layer can involve depositing a layer of a material selected to have a stiffness that is greater than a stiffness of the substrate and one or more of the first, second, and third film layers.

In another aspect, the presently disclosed subject matter can provide a method and structure for fabricating a suspended, single-layer MEMS structure. The method and structure can include providing a substrate, depositing a sacrificial layer on the substrate, depositing a film layer on the substrate and over the sacrificial layer, and removing the sacrificial layer by etching to suspend at least a portion of the film layer in a spaced-apart manner over the substrate. Depositing the sacrificial layer can involve depositing a layer of a material selected to have a stiffness that is greater than a stiffness of the substrate and a stiffness of the film layer.

In yet another aspect, the presently disclosed subject matter can provide a multilayer structure for a micro electro-mechanical device. The structure can include a substrate, a lower sacrificial layer deposited on the substrate, an insulation layer deposited on the lower sacrificial layer, a first film layer deposited on the insulation layer, a second film layer deposited on the first film layer, a third film layer deposited on the second film layer, and a insulation balance layer deposited on the third film layer. The deposited layers can be patterned and etched to define a multilayer structure, and the sacrificial layer can be a layer of a material selected to have a stiffness that is greater than a stiffness of the substrate and a stiffness of one or more of the first, second, and third film layers.

Additional features of the presently disclosed subject matter will become evident as the description proceeds when taken in connection with the accompanying drawings as described hereinbelow.

BRIEF DESCRIPTION OF THE DRAWINGS

The subject matter described herein will now be explained with reference to the accompanying drawings of which.

DETAILED DESCRIPTION

In accordance with the present disclosure, methods and devices for fabricating MEMS devices on compliant layers are provided. In particular, the disclosed methods and devices can include the use of a sacrificial layer that can be deposited between a substrate and one or more device layers. The sacrificial layer can have specified mechanical properties to elicit a specific but optimal result for the MEMS devices produced. The demonstration of optimal performance can be seen both in functional behavior (e.g. actuation voltage, capacitance, beam shape) and yield (variation in behavior across an array, die, wafer, lot, yieldable function die per wafer, etc). As described hereinbelow, the specific material properties that can be controlled can for example include stiffness (as measured by Young's modulus and Poisson ratio), coefficient of thermal expansion (CTE), and/or glass transition temperatures ($T_g$), among other properties.

For purpose of the description herein, it is understood that when a component such as a layer or substrate is referred to as being "disposed on", "attached to", or "formed on" another component, that component can be directly on the other component or, alternatively, intervening components (for example, one or more buffer or transition layers, interlayers, electrodes, or contacts) can also be present. Furthermore, it is understood that the terms "disposed on", "attached to", and "formed on" are used interchangeably to describe how a given component can be positioned or situated in relation to another component. Therefore, it will be understood that the terms "disposed on", "attached to", and "formed on" do not introduce any limitations relating to particular methods of material transport, deposition, or fabrication.

Contacts, interconnects, conductive vias, electrothermal components, and electrodes of various metals can be formed by sputtering, CVD, evaporation, or electroplating. Some metals might require an appropriate intermediate adhesion layer to prevent peeling. Examples of adhesion material often used include chromium, titanium, or an alloy such as titanium-tungsten (TiW) or titanium-nitride (TiN). Some metal combinations can require a diffusion barrier to prevent an adhesion layer from diffusing through the metal and vice versa.

Conventional lithographic techniques can be employed in accordance with fabrication, such as micromachining, of the subject matter described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of enchant used will depend on the composition of material to be removed, the composition of any masking or etch-stop layer to be used, and the profile of the etched region to be formed.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to this disclosure as starting substrates for the fabrication of microstructures.

An alternative patterning process to etching is the lift-off process as known to those of skill in the art. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component." As used herein, the term "conductive" is generally taken to encompass both conducting and semi-conducting materials.

Embodiments of methods and devices for fabricating tri-layer beams in accordance with the subject matter disclosed herein will now be described with reference to the various figures of drawings.

Figures 1, 2, 3:
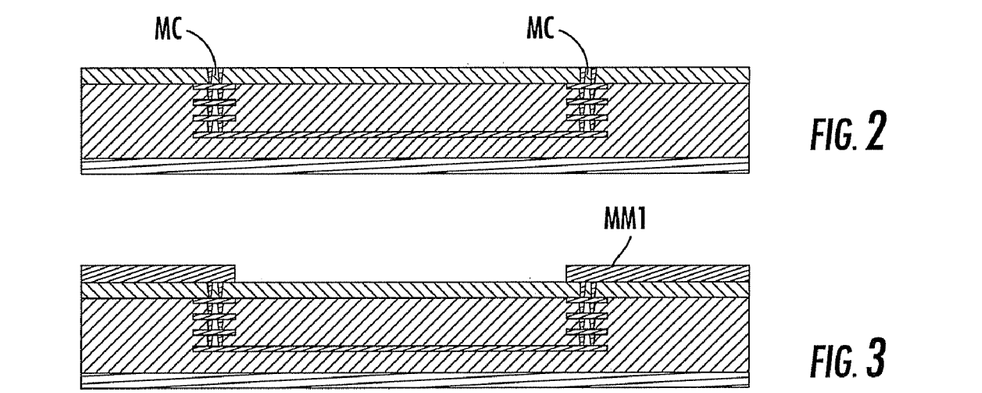
FIGS. 1 through 24 are cross-sectional side views of progressive steps that can occur in the fabrication of a multilayer structure according to one aspect of the subject matter disclosed herein.
Figure 4:
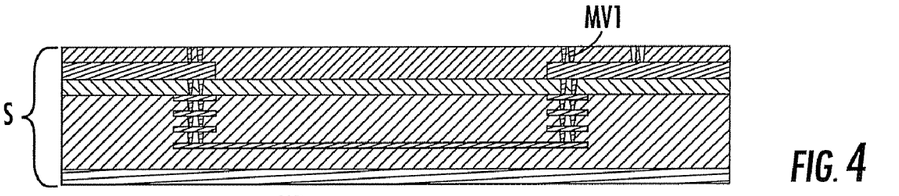
Figure 5:
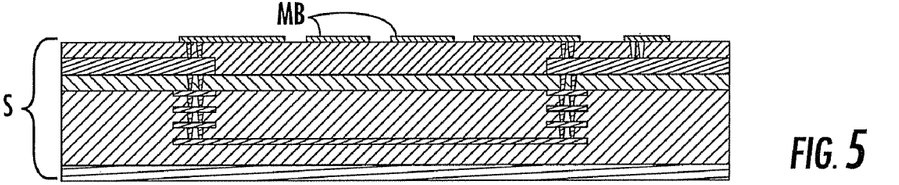
Figure 6:
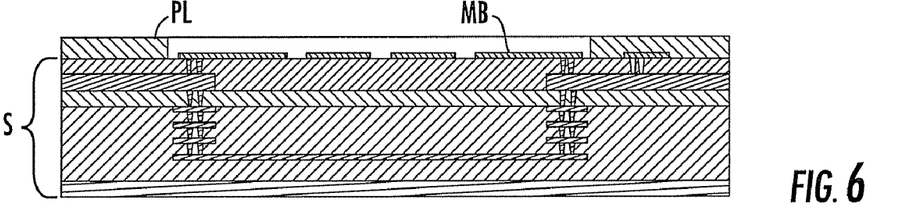
Figure 7:
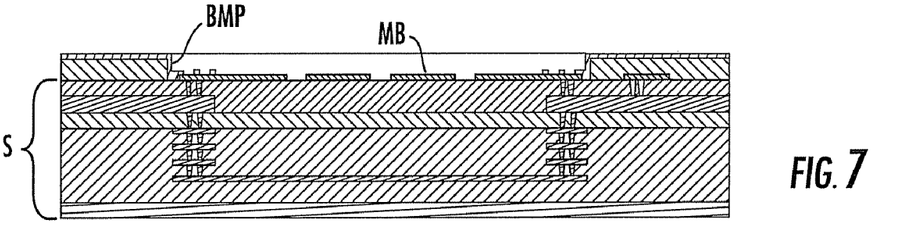
Figure 8:
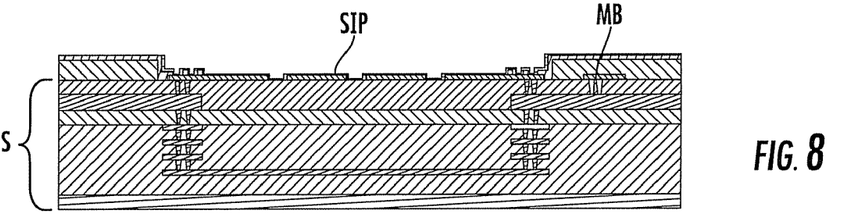

In one aspect, the presently disclosed subject matter provides a method and structure for fabricating a suspended, tri-layer MEMS structure. The method can include providing a substrate S. In one example, substrate S can be composed of a silicon starting wafer W with a 4-metal HVCMOS process, illustrated in FIG. 1. As depicted in FIG. 2, a connection MC can be created to interconnect the HVCMOS to the MEMS device to be fabricated. Referring to FIG. 3, a metal layer MM1 can be deposited and patterned. Referring to FIG. 4, an oxide layer can then be deposited above the metal layer, with a via MV1 formed to metal layer MM1. Thus, in this example, the structure formed by these steps shown in FIGS. 1-4 can form substrate S. In addition, as is depicted in FIG. 5, a base metal layer MB can be deposited, patterned, and etched on substrate S. Furthermore, as is illustrated in FIG. 6, another oxide layer PL can be deposited and planarized above base metal layer MB, with a cavity etched therein. FIG. 7 illustrates an additional oxide layer BMP that can be deposited, patterned, and etched in the cavity. FIG. 8 illustrates the deposition of an oxide layer SIP over substrate S.

Figure 9:
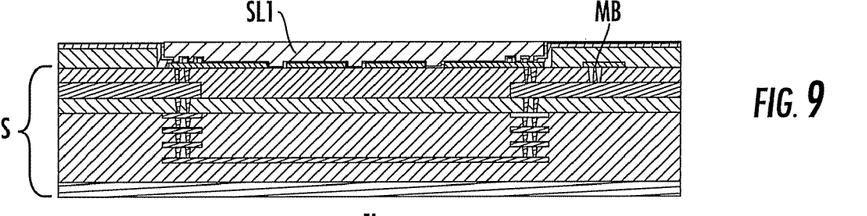

The method can further depositing a lower sacrificial layer SL1 on substrate S, which is illustrated in FIG. 9. Lower sacrificial layer SL1 can be deposited as a single layer or as multiple layers. Examples of materials that can be used for substrate S include silicon, aluminum, ceramic, quartz, sapphire, gallium arsenide (GaAs), gallium nitride (GaN), silicon-on-insulator (SOI), glass (e.g., Pyrex®), and other materials known in the art.

Likewise, lower sacrificial layer SL1 can be formed from a wide variety of materials, including for example silicon, silicon oxide (SiO), PSG, borophosphosilicate glass (BPSG), copper, aluminum, gold, photoresist, polyimide, or other materials known in the art. In embodiments where lower sacrificial layer SL1 comprises an organic material, such as photoresist or polyimide for example, lower sacrificial layer SL1 can be characterized by a glass transition temperature ($T_g$). In these cases, the material can be selected to have a $T_g$ that is higher than the deposition temperature of subsequent device layers or subsequent annealing temperatures.

Lower sacrificial layer SL1 can be deposited directly on substrate S or on other underlying materials. For instance, as noted above, the underlying materials can include dielectrics (e.g., oxide, nitrides, low-k, high-k, organics, inorganics), metals (e.g., Al, Cu, Ti, W, Ni, Au), semiconductors (e.g., polysilicon), piezoelectrics/ferroelectrics (e.g. ZnO, SBT, PZT), semi-metals, or conductive oxides and silicides. Further, the underlying layers can include other MEMS, CMOS, or other IC layers.

In addition, lower sacrificial layer SL1 can be patterned on substrate S such that it is located in specific areas and is a small fraction of the total substrate area. The sacrificial deposition process can also include a thermal treatment or curing cycle, which can be considered typical for an organic material. Also, if lower sacrificial layer SL1 comprises multiple material layers, the layers can be patterned separately.

Regardless of the material selected or the specific configuration of lower sacrificial layer SL1, the material for lower sacrificial layer SL1 can be selected to be qualifiedly rigid. Stated otherwise, in comparison to the elastic modulus of substrate S and any subsequently-deposited device layers, the elastic modulus of sacrificial material SL1 can be comparable or greater.

Figure 10:
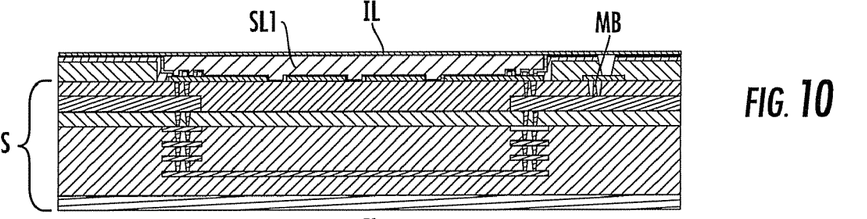
Figure 11:
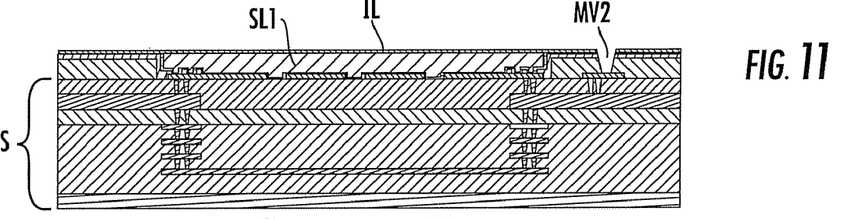

Furthermore, the method can optionally include the deposition of an insulation layer IL, which is depicted in FIG. 10. Insulation layer IL can serve as an etch stop, a protective layer for lower sacrificial layer SL1, as a capacitor dielectric, and/or as an encapsulant to isolate any metal layers and lines. Insulation layer IL can be a continuous, contiguous, conformal layer that can be deposited on lower sacrificial layer SL1. One common example of an insulation layer IL is a dielectric, such as silicon nitride, silicon oxide, or other high-k or low-k dielectric. The thickness of insulation layer IL formed can be selected based one or more factors, including: 1) the ability to act as an etch stop for subsequent metal etches without the etch penetrating insulation layer IL to the underlying lower sacrificial layer SL1; 2) the ability to provide a leakage barrier and to support the voltage across metal layers; 3) the ability to provide a specific capacitance density for a fixed capacitor or a tunable capacitor; and/or 4) the ability to provide a barrier for subsequent etch or photolithography steps. As is depicted in FIG. 11, a via MV2 can be etched through the insulation layer IL and any underlying layers for electrical contact between components of substrate S and subsequently-deposited device layers.

Figure 12:
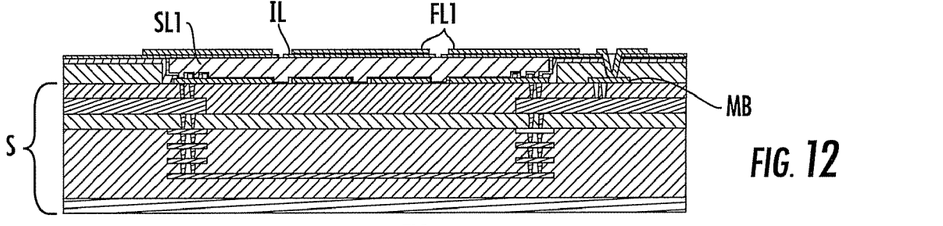

Regarding the subsequently-deposited device layers discussed above, the disclosed method can further include depositing a first film layer FL1 (e.g., a first conducting layer) on substrate S and over the lower sacrificial layer SL1. As illustrated in FIG. 12, first film layer FL1 can be patterned so that a portion of first film layer FL1 can remain on the sacrificial material, a portion can remain on substrate S, and a portion can be continuous from substrate S, over the sacrificial step, and onto the sacrificial material. First film layer FL1 can also include a cladding layer on one or both sides. Examples of such a cladding layer can include an adhesion layer, a diffusion barrier, or an antireflective coating. First film layer FL1 can be a metal (e.g. Al, Au, Cr, PZT), and the metal film can have material characteristics that are elastic, elastic-perfectly plastic, elastic-plastic (with hardening), or elastic-plastic including creep. First film layer FL1 can be deposited by high temperature or low temperature processes. Further, first film layer FL1 can be submitted to subsequent thermal treatments and anneals.

Figure 13:
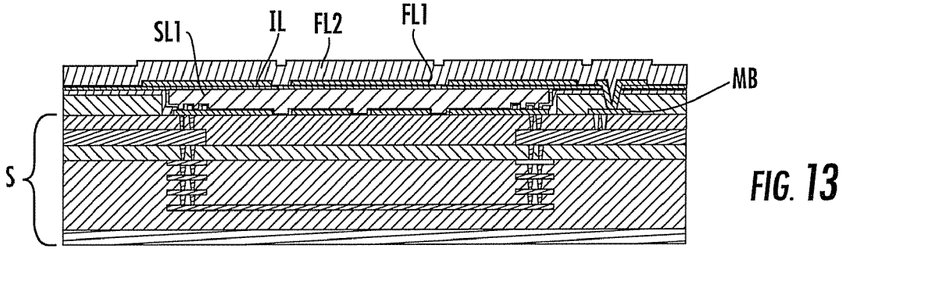
Figure 14:
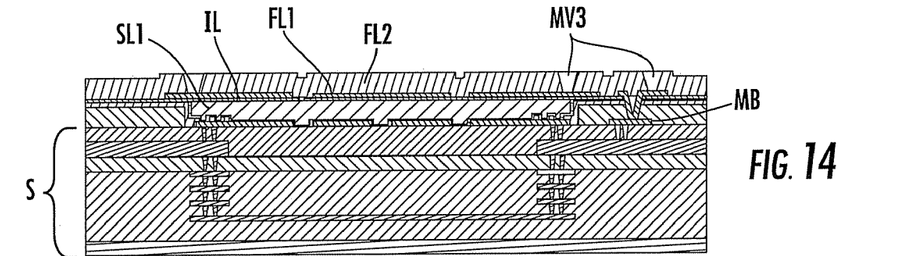

Referring to FIG. 13, a second film layer FL2 (e.g., an insulating layer) can be deposited on first film layer FL1. Second film layer FL2 can be a layer of dielectric material (e.g., silicon oxide, silicon nitride, aluminum oxide), and in some embodiments can be a linear elastic film. In one particular example, second film layer FL2 can be a continuous, contiguous, conformal beam oxide layer that can encapsulate first film layer FL1. Second film layer FL2 can be deposited at a temperature that is lower, equal to, or higher than the deposition temperature of the first film layer FL1. Similarly to first film layer FL1, second film layer FL2 can be patterned so that a portion of second film layer FL2 remains on lower sacrificial layer SL1, a portion remains on substrate S, and a portion is continuous from substrate S, over the sacrificial step, and onto the sacrificial material. Further, as is depicted in FIG. 14, a via MV3 can be etched through second film layer FL2 to form an electrical contact between first film layer FL1 and subsequently-deposited device layers.

Figure 15:
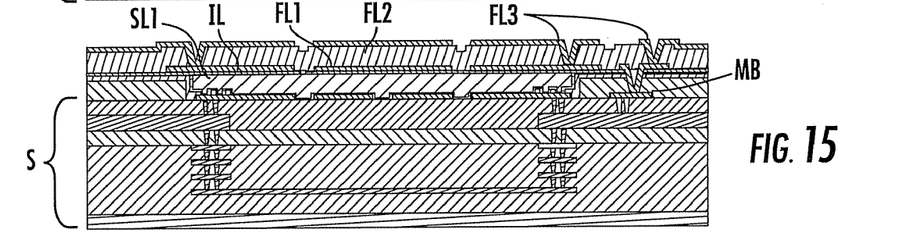

Referring to FIG. 15, a third film layer FL3 (e.g., a second conducting layer) can be deposited on second film layer FL2. Third film layer FL3 can be a metal layer, such as an aluminum alloy (e.g., Al-0.5% Cu plus cladding) or another metal such as gold, copper, or nickel. In addition, third film layer FL3 can include a cladding layer on one or both sides. Third film layer FL3 can be deposited, photo-patterned, and etched to match the extent of first film layer FL1. Examples of such a cladding layer can include an adhesion layer, a diffusion barrier, or an antireflective coating. Similarly to the underlying film layers, third film layer FL3 can be patterned on top of substrate S and lower sacrificial layer SL1. Specifically, third film layer FL3 can be patterned so that a portion of the film remains on the sacrificial material, a portion remains on substrate S, and a portion is continuous from substrate S, over the sacrificial step, and onto the sacrificial material.

Third film layer FL3 can be deposited at a temperature that is lower, equal to, or higher than the deposition temperature of first film layer FL1 or second film layer FL2. For instance, third film layer FL3 can be deposited at the same temperature as first film layer FL1 to have a high degree of symmetry. Likewise, third film layer FL3 can comprise the same material as first film layer FL1 to have a high degree of symmetry. Alternatively, third film layer FL3 can be slightly different from first film layer FL1 to compensate for slight differences in intrinsic stress or stress gradients within films or interfacial stresses. For example, third film layer FL3 can differ in its thickness, doping, or cladding layers (where the cladding layer can differ in symmetry, thickness, or type).

Figure 16:
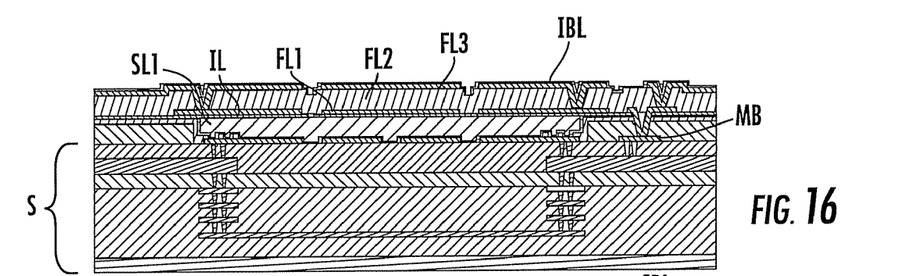

Furthermore, the method can optionally include the deposition of an insulation balance layer IBL, which is depicted in FIG. 16. Insulation balance layer IBL can provide mechanical and thermo-mechanical compensation for the addition of insulation layer IL. Insulation balance layer IBL can be deposited using the same material and same thickness as insulation layer IL to provide a high degree of symmetry, which can be defined in terms of geometric, mechanical, and thermomechanical symmetry. In this form, the primary functional purpose for insulation balance layer IBL can be to match insulation layer IL. A secondary purpose of insulation balance layer IBL can be to encapsulate third film layer FL3 and to provide mechanical compensation. A cumulative effect of the layer deposition can result in some stress gradient that can curve the as-released beam shape. Insulation balance layer IBL, being the last deposited layer, can thus provide at least some compensation for stress gradients and shape. In addition, other asymmetries can be set up by stress gradients through the beam, which means the insulation balance layer IBL can compensate for secondary factors such as slight geometric asymmetries created by cladding construction of conformal processes and as stress gradient asymmetries. Of course, there are trade-offs between the degree of compensation versus the degree of symmetry.

Figure 17:
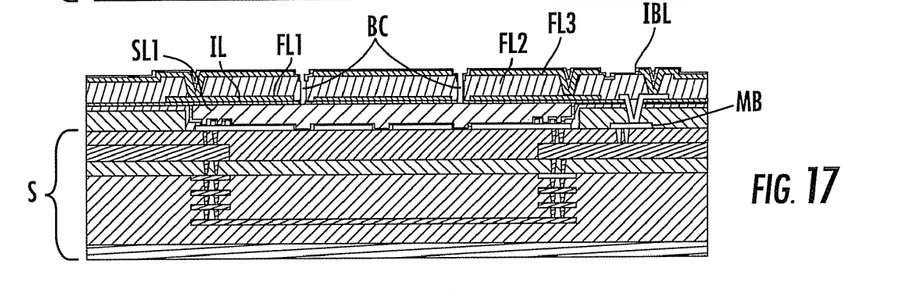

Once all of the device layers have been deposited and patterned, lower sacrificial layer SL1 can be removed. Referring to FIG. 17, a beam cut etch BC can be created to define device perimeter and release etch holes through the device layers. Sacrificial layer SL1 can thus be removed by etching to suspend at least a portion of the tri-film structure in a spaced-apart manner over substrate S. The sacrificial etch can involve a wet process (e.g., HF, sulphuric+peroxide) or a dry process (e.g., oxygen plasma, $SF_6$, $XeF_2$). The etchant for the sacrificial material can be selected to be compatible with substrate S and other underlying materials. In addition, the sacrificial etch can be selective to one or more of the first, second, and third film layers FL1, FL2, and FL3. Alternatively, if the sacrificial layer is not selective to the film layers, these film layers can be compensated and/or protected so as to not be removed by the etching step.

As noted above, the material used for lower sacrificial layer SL1 can be selected based on its material properties relative to the properties of substrate S and the device layers. In one embodiment, this relationship can mean that depositing lower sacrificial layer SL1 can involve depositing a layer of a material selected to have a stiffness that is greater than a stiffness of substrate S and a stiffness of one or more of the subsequently-deposited device layers. Of course, this difference in stiffness need not be substantial. For instance, depositing lower sacrificial layer SL1 can involve depositing a layer of a material selected to have a stiffness that is substantially similar to the stiffness of substrate S and the stiffness of one or more of the device layers.

An optimal range of material properties can be determined for lower sacrificial layer SL1 depending on the properties of the deposited films and the total thermal history of the process. The thermal history of the process can include: deposition temperatures of any metal layers (e.g., Au, Cu, Al, Ti, Ta, W, TiN, Cr, Mo, Ni), dielectric layers (e.g., oxide, nitride, alumina, HfO), semiconductor layers (e.g., polysilicon, porous silicon, SiC, poly-SiGe), organic material layers (e.g. polyimide, SU8, ashable hard masks such as amorphous carbon); differences in deposition temperatures (metals at a different temperature than oxides); curing (i.e., curing, soft bake out, hard bake out, high temperature outgassing, annealing of organic materials); room- or high-temperature creep that can be associated with queue times or dwell times; and photolithography steps associated with photoresist processing.

Using a sacrificial layer comprising a material selected based on its properties in this way can reduce the sensitivity of the final device shape to process parameters (e.g., specific deposition temperatures, deposition temperature differences (i.e. metal versus oxide), specific material parameters (e.g., elastic modulus, Poisson ratio, CTE of sacrificial layer, plasticity properties of metals, glass transition temperature of sacrificial layers), time (e.g., deposition time, dwell time, queue time), and/or geometry (e.g., sacrificial layer thickness, device layer thickness, device layer pattern, device layer length or aspect ratio). In addition, a sacrificial layer of this kind can improve final as-built shape of released devices and reduces variability in the as-built shape, eliminate decoupling of the deposited layers from substrate S that can occur with a more flexible sacrificial material, and generally reduce variability of devices across a product array, die, or wafer.

The material for lower sacrificial layer SL1 can also be selected to have other specific material properties that are related to the material properties of one or more of the film layers FL1, FL2, and FL3. For instance, such material properties can include the sacrificial elastic modulus, Poisson ratio, coefficient of thermal expansion, thickness, characteristic length, characteristic temperature (i.e., melting point, softening point, glass transition temperature), yield, or viscoelastic properties, which can be selected in direct relation to the corresponding properties of one or more of the film layers.

For instance, in one particular example, the material used to form lower sacrificial layer SL1 can be selected to have a characteristic temperature (i.e., melting temperature, softening temperature, or glass transition temperature) that is greater than the deposition temperature of one or more of the first, second, and third film layers FL1, FL2, and FL3. Further, the material used for lower sacrificial layer SL1 can be selected to have a coefficient of thermal expansion that is substantially similar to the coefficient of thermal expansion of one or more of the first, second, and third film layers FL1, FL2, and FL3. Lower sacrificial layer SL1 can further be formed to have a thickness that is less than the thickness of first film layer FL1 such that first film layer FL1 is not substantially decoupled from substrate S that underlies sacrificial layer SL1.

In another particular example, lower sacrificial layer SL1 can be deposited as a layer of material selected to have an elastic modulus and a thickness in a specific relationship to the elastic modulus and thickness of first film layer FL1. The sacrificial properties can be related to those of first film layer FL1 by the following relationship:

$$\sqrt{\frac{(1+v_{sac})E_{film}}{2E_{sac}}\frac{t_{film}}{L}\frac{t_{sac}}{L}} \ll 1,$$

where $E_{film}$ is the elastic modulus of first film layer FL1, $E_{sac}$ is the elastic modulus of lower sacrificial layer SL1, $t_{film}$ is the thickness of first film layer FL1, $t_{sac}$ is the thickness of lower sacrificial layer SL1, and $v_{sac}$ is the Poisson ratio of the material that comprises lower sacrificial layer SL1.

In another example, lower sacrificial layer SL1 can be deposited at a specified temperature (e.g. 400° C.), with specific CTE (e.g. 2.5 ppm/° C.), and specific modulus (e.g. 80-100 GPa) in the context of the substrate S, to elicit yielding (i.e. plasticity effects) of the first and second film layers, FL1 and FL2 respectively.

Figure 18:
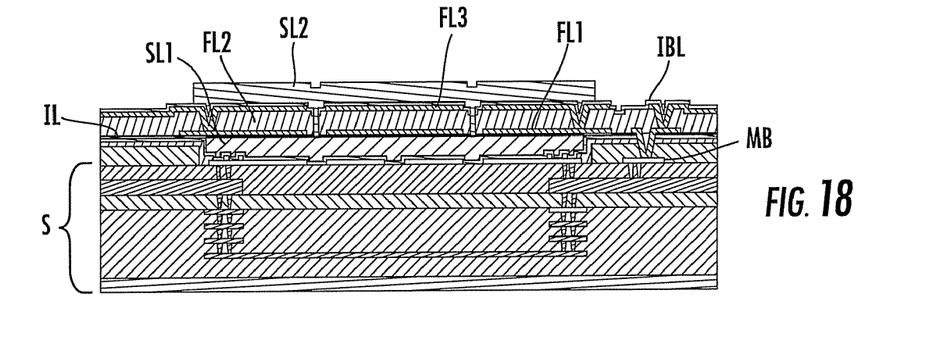

The method according to this aspect of the present subject matter can also include the deposition of an upper sacrificial layer SL2 on top of the tri-layer structure, which is depicted in FIG. 18. Upper sacrificial layer SL2 can be a compliant sacrificial layer or a more rigid sacrificial layer. Examples of materials that can be used to form upper sacrificial layer SL2 include polyimide, photoresist, silicon oxide, PSG, BPSG, silicon, aluminum, gold, copper, or another compatible material. Similarly to lower sacrificial layer SL1, upper sacrificial layer SL2 can be removed by a wet or dry etchant that is chemically compatible with the thin film structural material. In one embodiment, a single sacrificial etch can be used to remove upper sacrificial layer SL2 and lower sacrificial layer SL1. In this regard, the sacrificial layers can comprise the same material or of different materials. Alternatively, the sacrificial layers can require different sacrificial etches to remove the materials.

Figure 19:
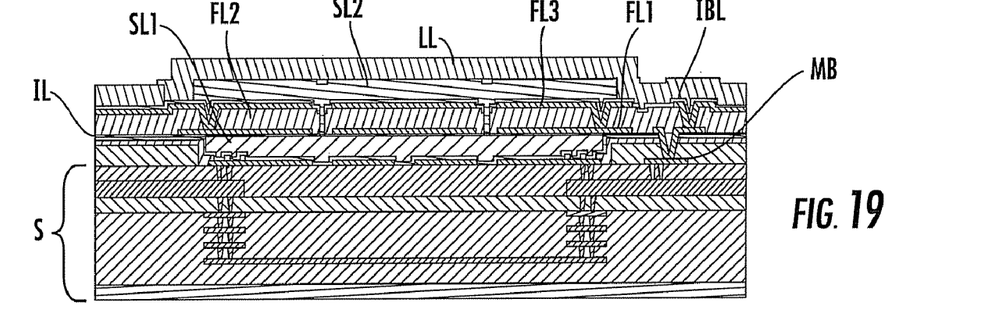
Figure 20:
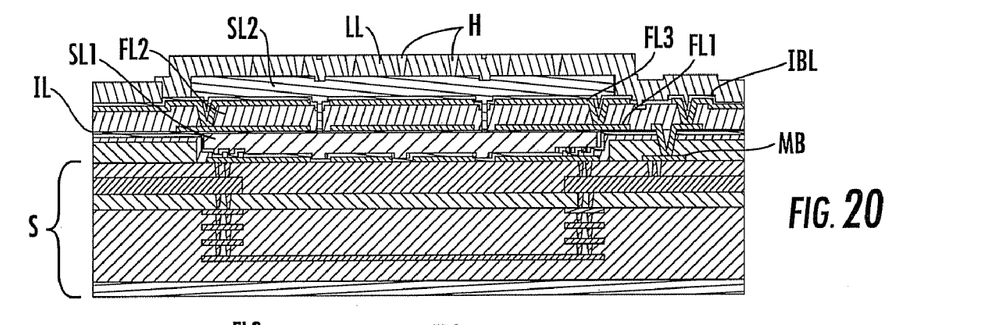
Figure 21:
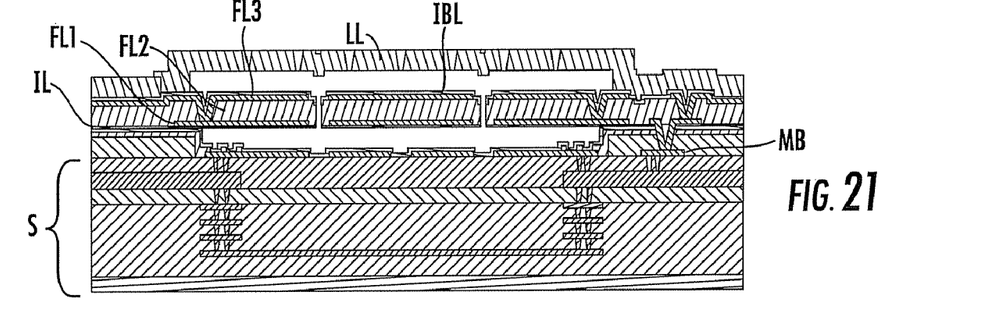
Figure 22:
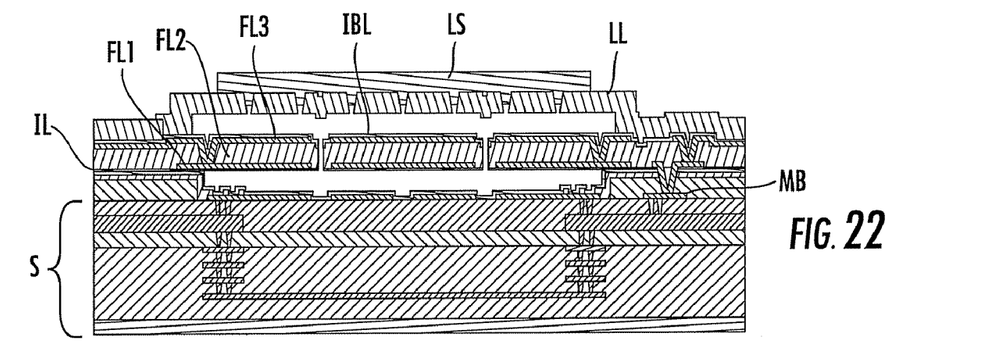
Figure 23:
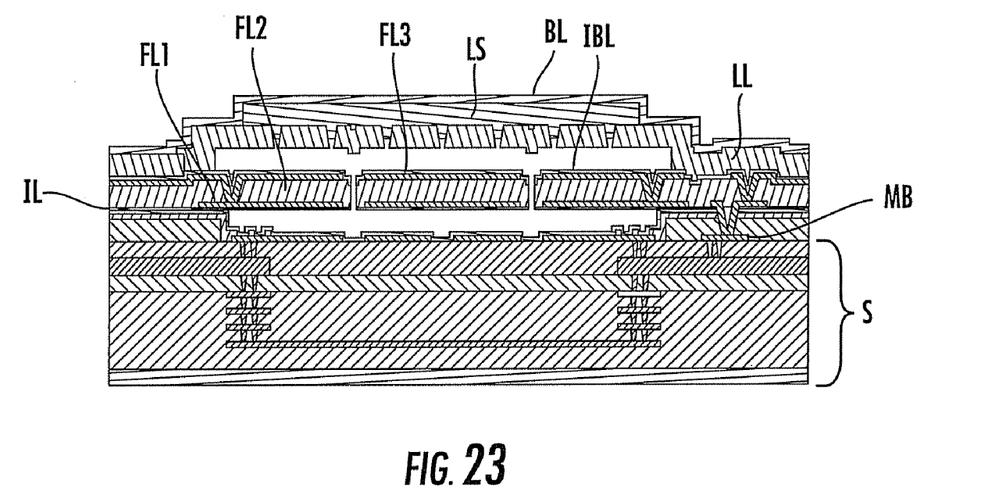
Figure 24:
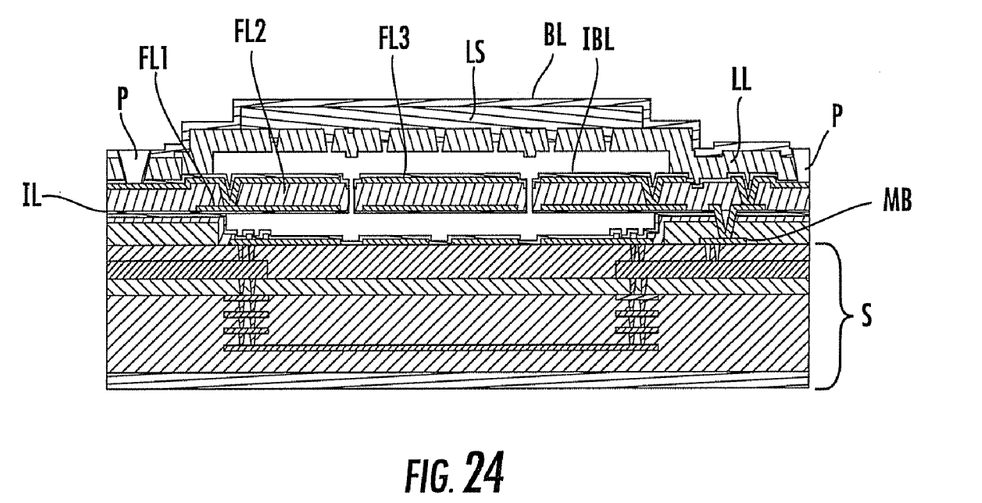
Figure 25:
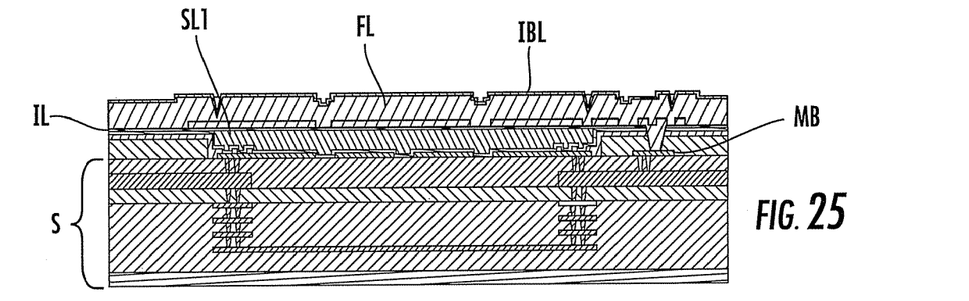
FIG. 25 through 33 are cross-sectional side views of progressive steps that can occur in the fabrication of a multilayer structure according to another aspect of the subject matter disclosed herein.

In addition, as is depicted in FIG. 19, a thin film encapsulation/lid layer LL can be deposited on substrate S and over upper sacrificial layer SL2, lower sacrificial layer SL1 and the structural film layers. Referring to FIG. 20, lid layer LL can be patterned and etched to provide holes H for the sacrificial release etchant to access the sacrificial layers. As a result, as is depicted in FIG. 21, both lower sacrificial layer SL1 and upper sacrificial layer SL2 can be removed. After the sacrificial etch is complete, the etch release holes can be sealed with one or more additional encapsulation layers, illustrated in FIG. 22. For instance, the etch release holes can be sealed with a second encapsulation layer LS, and as is depicted in FIG. 23 a third encapsulation layer can be used as a barrier material BL. In addition, referring to FIG. 24, pad openings P can be etched through the lid layer and other encapsulation layers.

The method can further include an additional thermal step. Specifically, substrate S and device films can be submitted to an anneal treatment. The anneal treatment can be performed before or after the sacrificial release etch and removal of one or both of lower sacrificial layer SL1 and upper sacrificial layer SL2. The anneal temperature can be lower than, equal to, or higher than the film deposition temperatures or thermal treatment of the sacrificial layers. For instance, the anneal treatment can be performed at 400° C. for 30-40 minutes.

In another aspect, depicted in FIGS. 25-33, the presently disclosed subject matter can provide a method and structure for fabricating a suspended, single-layer MEMS structure. The method can include providing a substrate S, depositing a lower sacrificial layer SL1 on substrate S, depositing a single film layer FL on substrate S and over lower sacrificial layer SL1, and removing lower sacrificial layer SL1 by etching to suspend at least a portion of film layer FL in a spaced-apart manner over substrate S. Similarly to the above described aspect, depositing lower sacrificial layer SL1 can involve depositing a layer of a material selected to have a stiffness that is greater than a stiffness of substrate S and a stiffness of film layer FL. The method and structure according to this aspect of the disclosed subject matter can contain many of the features disclosed above with respect to the methods and structures for fabricating the suspended tri-layer MEMS structure. In this aspect, however, only a single device layer is required.

With regard to film layer FL, it can be patterned so that a portion of film layer FL remains on the sacrificial material, a portion remains on substrate S, and a portion is continuous from substrate S, over the sacrificial step, and onto the sacrificial material. Film layer FL can be a metal (e.g. Al, Au, Cr, PZT), and the metal film can have material characteristics that are elastic, elastic-perfectly plastic, elastic-plastic (with hardening), or elastic-plastic including creep. In other embodiments, film layer FL can be a dielectric (e.g., silicon oxide, silicon nitride) or a semiconductor (e.g., polysilicon). Film layer FL can be deposited by high temperature or low temperature processes.

Figure 26:
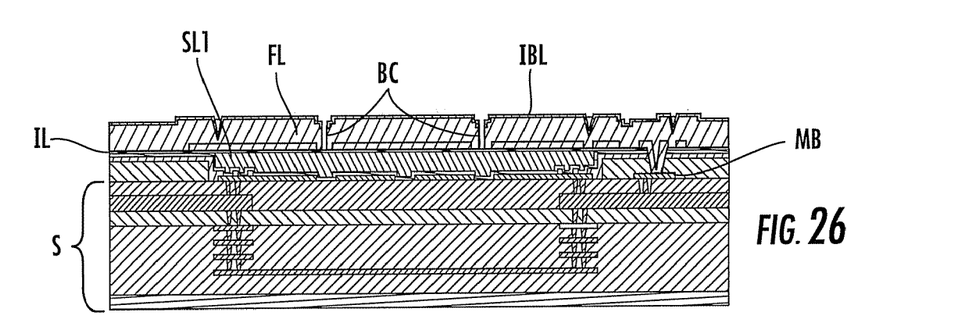
Figure 27:
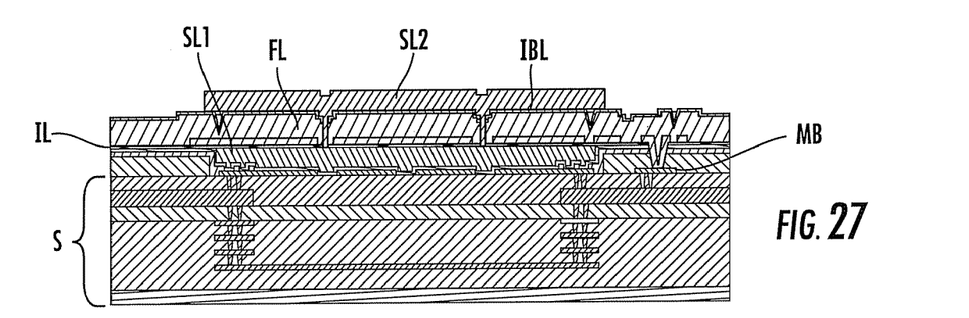
Figure 28:
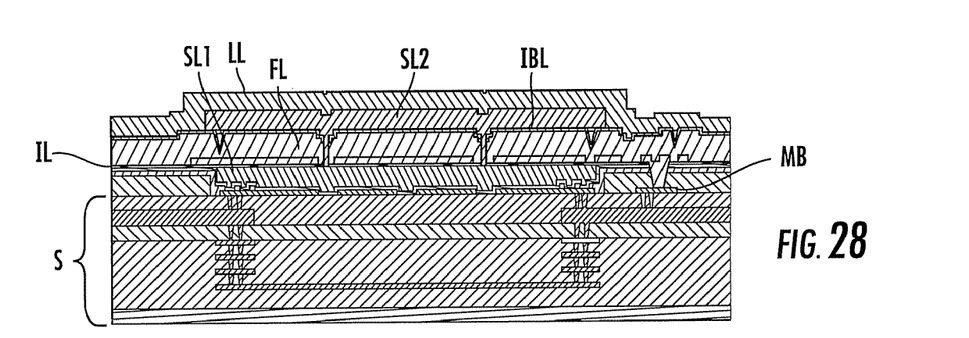
Figure 29:
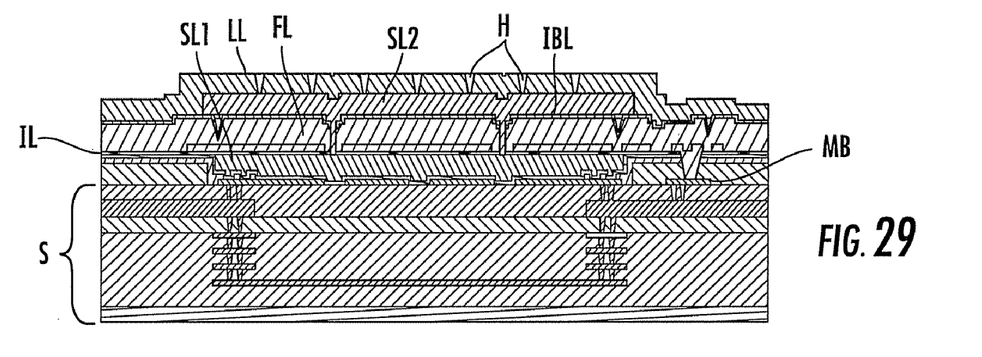
Figure 30:
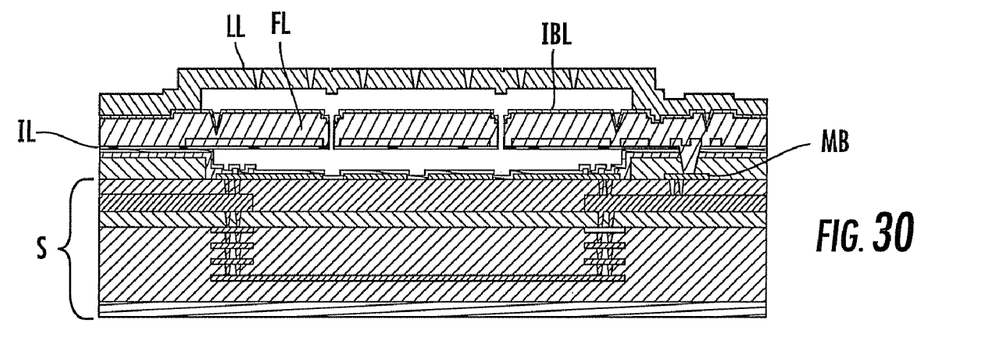
Figure 31:
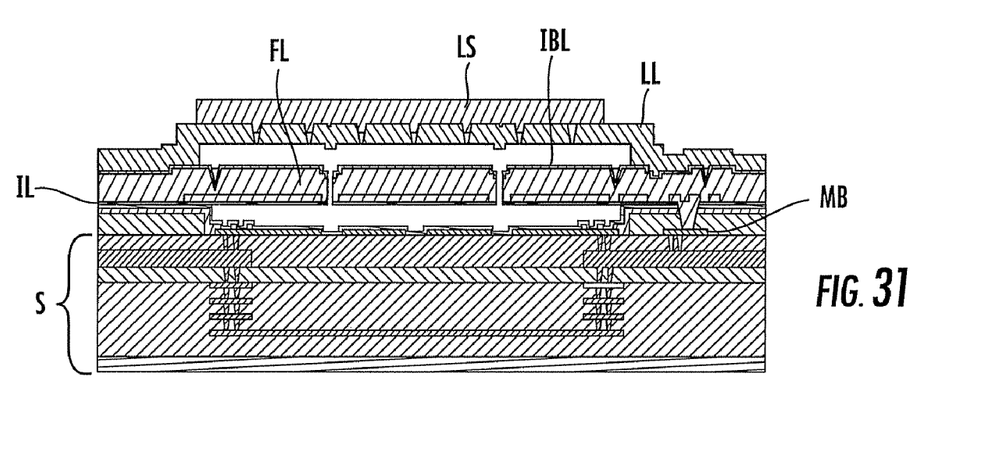
Figure 32:
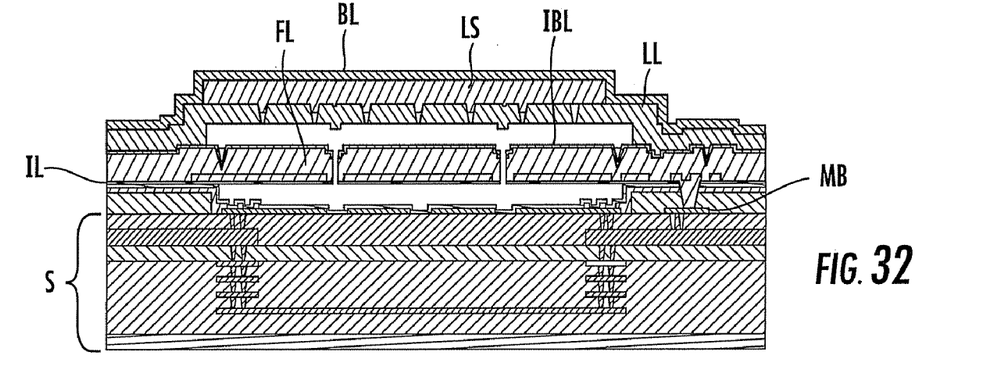
Figure 33:
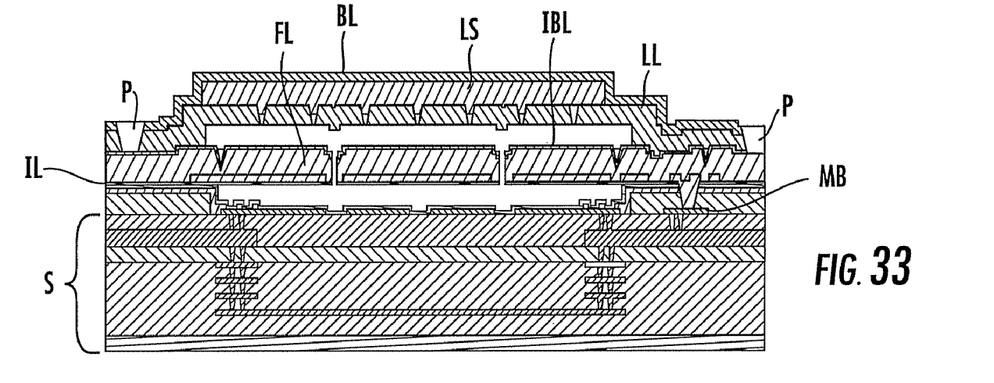

Referring now to FIG. 26, a beam cut etch BC can be made to define a device perimeter and release etch holes through film layer FL and terminating on lower sacrificial layer SL1. In addition, the method according to this aspect of the present subject matter can also include the deposition of an upper sacrificial layer SL2 on top of the single-layer structure, which is depicted in FIG. 27. Further, as depicted in FIG. 28, a thin film encapsulation/lid layer LL can be deposited on substrate S and over upper sacrificial layer SL2, lower sacrificial layer SL1 and the structural film layer. Referring to FIG. 29, the encapsulation layer can be patterned and etched with holes H terminating on upper sacrificial layer SL2. The method can further include removal of the sacrificial layers (see FIG. 30), deposition of a seal layer LS (see FIG. 31), deposition of a barrier layer BL (see FIG. 32), etching of pad openings P (see FIG. 33), and/or an anneal treatment.

As noted above, the selection of a material for use as one or both of lower sacrificial layer SL1 and upper sacrificial layer SL2 can be selected based on its material properties relative to the properties of substrate S and the device layers, just as could be done with respect to the tri-layer structure. In this regard, this relationship can mean that depositing lower sacrificial layer SL1 can involve depositing a layer of a material selected to have a stiffness that is greater than a stiffness of substrate S and a stiffness of film layer FL. Again, this difference in stiffness need not be substantial, and depositing lower sacrificial layer SL1 can involve depositing a layer of a material selected to have a stiffness that is substantially similar to the stiffness of substrate S and the stiffness of film layer FL.

The material for lower sacrificial layer SL1 can also be selected to have other specific material properties that are related to the material properties of film layer FL. For instance, such material properties can include the sacrificial elastic modulus, Poisson ratio, coefficient of thermal expansion, thickness, characteristic length, characteristic temperature (i.e., melting point, softening point, glass transition temperature), yield, or viscoelastic properties, which can be selected in direct relation to the corresponding properties of film layer FL.

For instance, in one particular example, the material used to form lower sacrificial layer SL1 can be selected to have a characteristic temperature (i.e., melting temperature, softening temperature, or glass transition temperature) that is greater than the deposition temperature of film layer FL. Further, the material used for lower sacrificial layer SL1 can be selected to have a coefficient of thermal expansion that is substantially similar to the coefficient of thermal expansion of film layer FL. In addition, lower sacrificial layer SL1 can further be deposited in a thickness that is less than the thickness of film layer FL.

In another particular example, lower sacrificial layer SL1 can be deposited as a layer of material selected to have an elastic modulus and a thickness in a specific relationship to the elastic modulus and thickness of film layer FL. The sacrificial properties can be related to those of film layer FL by the following relationship:

$$\sqrt{\frac{(1+v_{sac})E_{film}}{2E_{sac}} \frac{t_{film}}{L} \frac{t_{sac}}{L}} \ll 1,$$

where $E_{film}$ is the elastic modulus of film layer FL, $E_{sac}$ is the elastic modulus of lower sacrificial layer SL1, $t_{film}$ is the thickness of film layer FL, $t_{sac}$ is the thickness of lower sacrificial layer SL1, and $v_{sac}$ is the Poisson ratio of the material that comprises lower sacrificial layer SL1.

In another example, lower sacrificial layer SL1 can be deposited at a specified temperature (e.g. 400° C.), with specific CTE (e.g. 2.5 ppm/° C.), and specific modulus (e.g. 80-100 GPa) in the context of substrate S, to elicit yielding (i.e. plasticity effects) of the film layers, FL and FL2.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for fabricating a suspended, tri-layer MEMS structure, the method comprising:
    providing a substrate;
    depositing a sacrificial layer on the substrate;
    depositing a first film layer on the substrate and over the sacrificial layer;
    depositing a second film layer on the first film layer;
    depositing a third film layer on the second layer; and
    removing the sacrificial layer by etching to suspend at least a portion of the tri-layer structure in a spaced-apart manner over the substrate;
    wherein depositing the sacrificial layer comprises identifying a stiffness of the substrate and of one or more of the first, second, and third film layers, and selecting a material for the sacrificial layer having a stiffness that is greater than the stiffness of the substrate and of the one or more of the first, second, and third film layers.

2. The method of claim 1, wherein depositing the sacrificial layer comprises selecting a material for the sacrificial layer having a stiffness that is substantially similar to the stiffness of one or more of the substrate and the first, second, and third film layers.

3. The method of claim 1, wherein depositing the sacrificial layer comprises identifying a deposition temperature of one or more of the first, second, and third film layers, and selecting a material for the sacrificial layer having a characteristic temperature that is greater than the deposition temperature of the one or more of the first, second, and third film layers.

4. The method of claim 1, wherein depositing the sacrificial layer comprises identifying a coefficient of thermal expansion of one or more of the first, second, and third film layers, and selecting a material for the sacrificial layer having a coefficient of thermal expansion that is substantially similar to the coefficient of thermal expansion of the one or more of the first, second, and third film layers.

5. The method of claim 1, wherein depositing the sacrificial layer comprises depositing a layer of material having a thickness that is less than the thickness of the first film layer.

6. The method of claim 1, wherein the sacrificial layer has sacrificial properties and depositing the sacrificial layer comprises identifying an elastic modulus of the first film layer, and selecting a material for the sacrificial layer having an elastic modulus and a thickness in a specific relationship to the elastic modulus and thickness of the first film layer, and wherein the sacrificial properties are related to properties of the first film layer by the relationship $$\sqrt{\frac{(1+v_{sac})E_{film}}{2E_{sac}} \frac{t_{film}}{L} \frac{t_{sac}}{L}} \ll 1,$$

where $E_{film}$ is the elastic modulus of the first film layer, $E_{sac}$ is the elastic modulus of the sacrificial layer, $t_{film}$ is the thickness of the first film layer, $t_{sac}$ is the thickness of the sacrificial layer, and $v_{sac}$ is the Poisson ratio of the sacrificial layer.

7. The method of claim 6, wherein depositing the sacrificial layer comprises selecting a material for the sacrificial layer having specific material properties that are related to material properties of one or more of the film layers, wherein the specific material properties are selected from the group consisting of the sacrificial elastic modulus, Poisson ratio, coefficient of thermal expansion, thickness, characteristic length, characteristic temperature, yield, and viscoelastic properties.

8. The method of claim 1, wherein the sacrificial layer is deposited at specified temperatures, CTE, and elastic modulus to elicit yielding of one or more of the first, second, and third film layers.

9. A method for fabricating a suspended, single-layer MEMS structure, the method comprising:
   providing a substrate;
   depositing a sacrificial layer on the substrate;
   depositing a film layer on the substrate and over the sacrificial layer; and
   removing the sacrificial layer by etching to suspend at least a portion of the film layer in a spaced-apart manner over the substrate;
   wherein depositing the sacrificial layer comprises identifying a stiffness of the substrate and of the film layer, and selecting a material for the sacrificial layer having a stiffness that is greater than the stiffness of the substrate and the stiffness of the film layer.

10. The method of claim 9, wherein depositing the sacrificial layer comprises identifying a deposition temperature of the film layer, and selecting a material for the sacrificial layer having a characteristic temperature that is greater than the deposition temperature of the film layer.

11. The method of claim 9, wherein depositing the sacrificial layer comprises identifying a coefficient of thermal expansion of the film layer, and selecting a material for the sacrificial layer having a coefficient of thermal expansion that is substantially similar to the coefficient of thermal expansion of the film layer.

12. The method of claim 9, wherein depositing the sacrificial layer comprises depositing a layer of material having a thickness that is less than the thickness of the film layer.

13. The method of claim 9, wherein the sacrificial layer has sacrificial properties and depositing the sacrificial layer comprises identifying an elastic modulus of the film layer, and selecting a material for the sacrificial layer having an elastic modulus and a thickness in a specific relationship to the elastic modulus and thickness of the film layer, and wherein the sacrificial properties are related to properties of the film layer by the relationship $$\sqrt{\frac{(1+v_{sac})E_{film}}{2E_{sac}} \frac{t_{film}}{L} \frac{t_{sac}}{L}} \ll 1,$$

where $E_{film}$ is the elastic modulus of the film layer, $E_{sac}$ is the elastic modulus of the sacrificial layer, $t_{film}$ is the thickness of the film layer, $t_{sac}$ is the thickness of the sacrificial layer, and $v_{sac}$ is the Poisson ratio of the sacrificial layer.

14. The method of claim 13, wherein depositing the sacrificial layer comprises selecting a material for the sacrificial layer having specific material properties that are related to material properties of the film layer, wherein the specific material properties are selected from the group consisting of the sacrificial elastic modulus, Poisson ratio, coefficient of thermal expansion, thickness, characteristic length, characteristic temperature, yield, and viscoelastic properties.

15. The method of claim 9, wherein the sacrificial layer is deposited at specified temperatures, CTE, and elastic modulus to elicit yielding of the film layer.

\* \* \* \* \*